(12) United States Patent
Kondoh

(10) Patent No.: US 6,806,561 B2
(45) Date of Patent: Oct. 19, 2004

(54) ELECTRONIC APPARATUS

(75) Inventor: Akihiro Kondoh, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/739,634

(22) Filed: Dec. 20, 2000

(65) Prior Publication Data

US 2001/0005041 A1 Jun. 28, 2001

(30) Foreign Application Priority Data

Dec. 22, 1999 (JP) .......................................... 11-364448

(51) Int. Cl.[7] .............................................. H01L 23/02
(52) U.S. Cl. ...................... 257/678; 257/678; 257/433; 257/699; 257/731; 257/732; 385/14; 385/49; 385/53; 361/807; 361/809; 361/812; 439/76.1; 439/63; 439/493
(58) Field of Search .............................. 257/80–84, 433, 257/699, 731, 732, 678; 361/807, 809, 812, 820; 385/14, 49, 53, 76–78, 88, 89, 92, 139; 439/76.1, 63, 493

(56) References Cited

U.S. PATENT DOCUMENTS 6,004,046 A * 12/1999 Sawada ........................ 385/92
6,168,465 B1 * 1/2001 Hirota ......................... 439/579

FOREIGN PATENT DOCUMENTS

| JP | 7-218776 | 8/1995 |
| JP | 07-218776 A | 8/1995 |
| JP | 8-97447 | 4/1996 |
| JP | 9-270747 | 10/1997 |
| JP | 9-270747 A | 10/1997 |
| JP | 9-289329 | 11/1997 |
| JP | 10-282372 | 10/1998 |
| JP | 11-183758 | 7/1999 |

* cited by examiner

Primary Examiner—B. William Baumeister
Assistant Examiner—Chris C. Chu
(74) Attorney, Agent, or Firm—Burns, Doane, Swecker & Mathis, LLP

(57) ABSTRACT

An electronic apparatus of the present invention comprises an electronic circuit board; an electrically conductive casing for encasing the electronic circuit board; a semiconductor element module electrically connected to the electronic circuit board; and a resin fixture intervening between the electrically conductive casing and the semiconductor element module, the resin fixture mounted with the semiconductor element module and fitted to the electrically conductive casing. As a result, the resin fixture can suppress a transfer of heat generated in the electronic circuit board to the semiconductor element module.

13 Claims, 9 Drawing Sheets

Related Art

ELECTRONIC APPARATUS

BACKGROUND OF THE INVENTION

1. Field of the Invention

The present invention relates generally to an electronic apparatus having a coaxial semiconductor element module, and more particularly to an optical transmitter/receiver having as its basis configuration a coaxial optical semiconductor module, a photoelectronic circuit board, and an electrically conductive casing for electromagnetically shielding the circuit board, and used in, for example, an optical communication system executing transmission/reception and conversion of optical/electrical signals.

2. Description of the Related Art

FIG. 9A is an exploded view showing an example configuration of a typical optical transmitter/receiver 900; FIG. 9B is a side elevational view of the optical transmitter/receiver 900 illustrated in FIG. 9A; FIG. 9D is a front elevational view of the optical transmitter/receiver 900 illustrated in FIG. 9A. The optical transmitter/receiver 900 comprises a coaxial optical semiconductor element module 6; an electronic circuit board 7 electrically connected to the optical semiconductor element module 6 and having pads 8a and 8b on its surface; an electrically conductive casing 9 in the form of, e.g., a sheet metal box, which accommodates and electromagnetically shields the electronic circuit board 7; and a metal flange 10 interposed between the optical semiconductor element module 6 and the electrically conductive casing 9, a metal flange 10 being fitted with the optical semiconductor module 6 and fixedly secured to the electrically conductive casing 9 by means of screws 11a and 11b. The optical semiconductor element module 6 includes a stem 1 incorporating an optical semiconductor element; lead terminals 2a and 2b extending from the stem 1 for electrical connection with the optical semiconductor element; a can 3 partially covering the stem 1; a trunk 4 extending from the can 3; and a fiber 5 disposed on the trunk 4.

A conventional optical transmitter/receiver can be configured in the manner of the optical transmitter/receiver 900 described in the following. The electronic circuit board 7 is securely retained, for example by an adhesive, in the electrically conductive casing 9. The optical semiconductor element module 6 and the metal flange 10 are fixedly retained, for example by YAG welding. The electrically conductive casing 9 and the metal flange 10 are fastened together by screws or the like. The lead terminals 2a and 2b are connected to the pads 8a and 8b, respectively, for transmission/reception and conversion of optical/electric signals.

In the thus configured optical transmitter/receiver 900, however, due to the fixed connection via the metal flange 10 between the optical semiconductor element module 6 and the electrically conductive casing 9, heat generated in the electronic circuit board 7 firmly retained in the electrically conductive casing 9 can be transferred to the optical semiconductor module 6 by way of the metal flange 10, whereupon a variance of temperature arising from this heat may induce a degradation or a variation of characteristics of the optical semiconductor element module 6, making it difficult to obtain an optical transmitter/receiver exhibiting stable performance.

SUMMARY OF THE INVENTION

The present invention was conceived in order to solve the above problems. It is therefore an object of the present invention to provide a highly reliable optical transmitter/receiver using a resin flange for firmly fastening an optical semiconductor element module and an electrically conductive casing together, to thereby keep heat insulating properties between the optical semiconductor element module and the electrically conductive casing and present excellent and stable performances.

According to one aspect of the present invention there is provided an electronic apparatus comprising an electronic circuit board; an electrically conductive casing for encasing the electronic circuit board; a semiconductor element module electrically connected to the electronic circuit board; and a resin fixture intervening between the electrically conductive casing and the semiconductor element module, the resin fixture mounted with the semiconductor element module and fitted to the electrically conductive casing.

The electronic apparatus of the present invention allows the resin fixture to intervene between the electrically conductive casing and the semiconductor element module so as to be able to suppress transfer of heat generated in the electronic circuit board to the semiconductor element module. It is thus possible to suppress degradations and variations of characteristics of the semiconductor element module. As a result, an electronic apparatus having superior and stable performances can be provided.

In the electronic apparatus of the present invention, the resin fixture may have a notched portion formed in its outer wall, and the electrically conductive casing may be formed with a hooked portion which fits into the notched portion. The resin fixture may have a protrusion formed on its outer wall, and the electrically conductive casing may be formed with an insertion aperture for receiving the protrusion. This enables the resin fixture to be fastened to the electrically conductive casing without screwing or bonding. It is thus possible to reduce the number of assembling steps and the number of components.

In the electronic apparatus of the present invention, the semiconductor element module may have a raised portion formed on its outer surface at a site where the semiconductor element module is fitted to the resin fixture, and the resin fixture may have a recessed portion formed in its inner surface at a site where the semiconductor module is mounted, the recessed portion being fitted to the raised portion. This enables the semiconductor element module to easily be positioned relative to the resin fixture and the electrically conductive casing.

In the electronic apparatus of the present invention, the semiconductor element module may have an externally threaded portion formed on its outer surface at a site where the semiconductor element module is fitted to the resin fixture, and the resin fixture may have an internally threaded portion formed in its inner surface at a site where the semiconductor module is mounted, the externally threaded portion being screwed into the internally threaded portion.

In the electronic apparatus of the present invention, the semiconductor element module may have a recessed portion formed in its outer surface at a site where the semiconductor element module is fitted to the resin fixture, and the resin fixture may have a raised portion formed on its inner surface at a site where the semiconductor module is mounted, the raised portion being fitted to the recessed portion.

In the electronic apparatus of the present invention, the resin fixture may have a metal-plated outer surface. This enables the resin fixture to serve as an electromagnetic shield for the semiconductor element module so that an electronic apparatus having more stable performances can be provided.

In the electronic apparatus of the present invention, the electronic circuit board may be bonded to and encased in the electrically conductive casing by use of an electrically conductive adhesive, such as an adhesive sheet. This enables heat generated in the electronic circuit board to be transferred by the electrically conductive adhesive sheet to the electrically conductive casing so that a high-performance electronic apparatus having an increased allowable heat value can be provided.

In the electronic apparatus of the present invention, the semiconductor element module is preferably an optical semiconductor element module.

In the electronic apparatus of the present invention, the semiconductor element module may have a raised portion formed on its outer surface at a site where the semiconductor element module is fitted to the resin fixture, and the resin fixture may have a notched portion formed in its outer wall and have a recessed portion formed in the inner surface at a site where the semiconductor module is mounted, the recessed portion being fitted to the raised portion. The electrically conductive casing may be formed with a hooked portion which fits the notched portion of the resin fixture. This enables the resin fixture to be fastened to the electrically conductive casing without screwing or bonding so that the semiconductor element module can easily be positioned relative to the resin fixture and the electrically conductive casing.

In the electronic apparatus of the present invention, the semiconductor element module may have an externally threaded portion formed on its outer surface at a site where the semiconductor element module is fitted to the resin fixture, and the resin fixture may have a notched portion formed in its outer wall and have an internally threaded portion formed in its inner surface at a site where the semiconductor module is mounted, the externally threaded portion being screwed into the internally threaded portion. The electrically conductive casing may be formed with a hooked portion which fits the notched portion of the resin fixture. This enables the resin fixture to be fastened to the electrically conductive casing without screwing or bonding so that the semiconductor element module can easily be positioned relative to the resin fixture and the electrically conductive casing.

In the electronic apparatus of the present invention, the semiconductor element module may have a recessed portion formed in its outer surface at a site where the semiconductor element module is fitted to the resin fixture, and the resin fixture may have a notched portion formed in its outer wall and have a raised portion formed on its inner surface at a site where the semiconductor module is mounted, the raised portion being fitted to the recessed portion. The electrically conductive casing may be formed with a hooked portion which fits the notched portion of the resin fixture. This enables the resin fixture to be fastened to the electrically conductive casing without screwing or bonding so that the semiconductor element module can easily be positioned relative to the resin fixture and the electrically conductive casing.

In the electronic apparatus of the present invention, the semiconductor element module may have a raised portion formed on its outer surface at a site where the semiconductor element module is fitted to the resin fixture, and the resin fixture may have a protrusion formed on its outer surface and have a recessed portion formed on its inner surface at a site where the semiconductor module is mounted, the recessed portion being fitted to the raised portion. The electrically conductive casing may be formed with an insertion hole which receives the protrusion of the resin fixture.

In the electronic apparatus of the present invention, the semiconductor element module may have an externally threaded portion formed on its outer surface at a site where the semiconductor element module is fitted to the resin fixture, and the resin fixture may have a protrusion formed on its outer surface and have an internally threaded portion formed in its inner surface at a site where the semiconductor module is mounted, the externally threaded portion being screwed into the internally threaded portion. The electrically conductive casing may be formed with an insertion hole which receives the protrusion of the resin fixture. This enables the resin fixture to be fastened to the electrically conductive casing without screwing or bonding.

In the electronic apparatus of the present invention, the semiconductor element module may have a recessed portion formed in its outer surface at a site where the semiconductor element module is fitted to the resin fixture, and the resin fixture may have a protrusion formed on its outer surface and have a raised portion formed on its inner surface at a site where the semiconductor module is mounted, the raised portion being fitted to the recessed portion. The electrically conductive casing may be formed with an insertion hole which receives the protrusion of the resin fixture. This enables the resin fixture to be fastened to the electrically conductive casing without screwing or bonding so that the semiconductor element module can easily be positioned relative to the resin fixture and the electrically conductive casing.

In the electronic apparatus of the present invention, the resin fixture may have a notched portion formed in its outer wall and have a protrusion formed on its outer surface, and the electrically conductive casing may be formed with a hooked portion which fits the notched portion and with an insertion hole which receives the protrusion. This enables the resin fixture to be fastened to the electrically conductive casing without screwing or bonding.

In the electronic apparatus of the present invention, the semiconductor element module may have a raised portion formed on its outer surface at a site where the semiconductor element module is fitted to the resin fixture, and the resin fixture may have a notched portion formed in its outer wall and a protrusion formed on its outer surface and have a recessed portion formed in the inner surface at a site where the semiconductor module is mounted, the recessed portion being fitted to the raised portion. The electrically conductive casing may be formed with a hooked portion which fits the notched portion of the resin fixture and with an insertion hole which receives the protrusion of the resin fixture. This enables the resin fixture to be fastened to the electrically conductive casing without screwing or bonding so that the semiconductor element module can easily be positioned relative to the resin fixture and the electrically conductive casing.

In the electronic apparatus of the present invention, the semiconductor element module may have an externally threaded portion formed on its outer surface at a site where the semiconductor element module is fitted to the resin fixture, and the resin fixture may have a notched portion formed in its outer wall and a protrusion formed on its outer surface and have an internally threaded portion formed in the inner surface at a site where the semiconductor module is mounted, the externally threaded portion being screwed into the internally threaded portion. The electrically conductive casing may be formed with a hooked portion which fits in the notched portion of the resin fixture and with an insertion hole which receives the protrusion of the resin fixture. This enables the resin fixture to be fastened to the electrically conductive casing without screwing or bonding.

In the electronic apparatus of the present invention, the semiconductor element module may have a recessed portion formed in its outer surface at a site where the semiconductor element module is fitted to the resin fixture, and the resin fixture may have a notched portion formed in its outer wall and a protrusion formed on its outer surface and have a raised portion formed on its inner surface at a site where the semiconductor module is mounted, the raised portion being fitted to the recessed portion. The electrically conductive casing may be formed with a hooked portion which fits the notched portion of the resin fixture and with an insertion hole which receives the protrusion of the resin fixture. This enables the resin fixture to be fastened to the electrically conductive casing without screwing or bonding so that the semiconductor element module can easily be positioned relative to the resin fixture and the electrically conductive casing.

BRIEF DESCRIPTION OF THE DRAWINGS

The above and other objects, aspects, features and advantages of the present invention will become more apparent from the following detailed description when taken in conjunction with the accompanying drawings, in which.

DESCRIPTION OF THE PREFERRED EMBODIMENTS

Figure 1A:
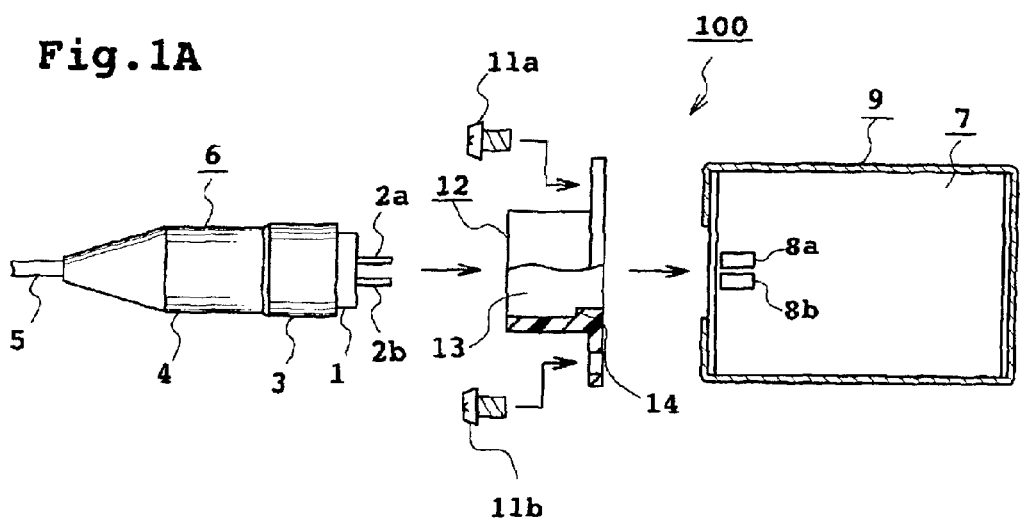
FIG. 1A is an exploded view showing an example of configuration of an optical transmitter/receiver 100.

Optical transmitters/receivers in accordance with embodiments of the present invention will now be described with reference to the accompanying drawings in which members taking on the same or similar functions are designated by the same reference numerals throughout several views. Although the present invention is described by way of presently preferred embodiments thereof, it will be understood that the present invention is limited by no means to such embodiments and that it could variously be embodied without departing from the sprit of the present invention.

Figure 1B:
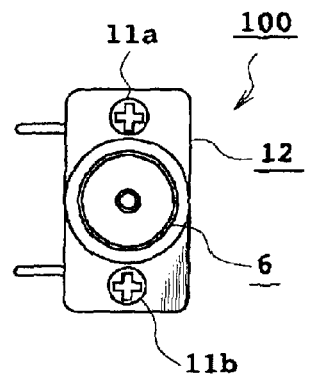
FIG. 1B is a side elevational view of the optical transmitter/receiver 100 depicted in FIG. 1A.
Figure 1C:
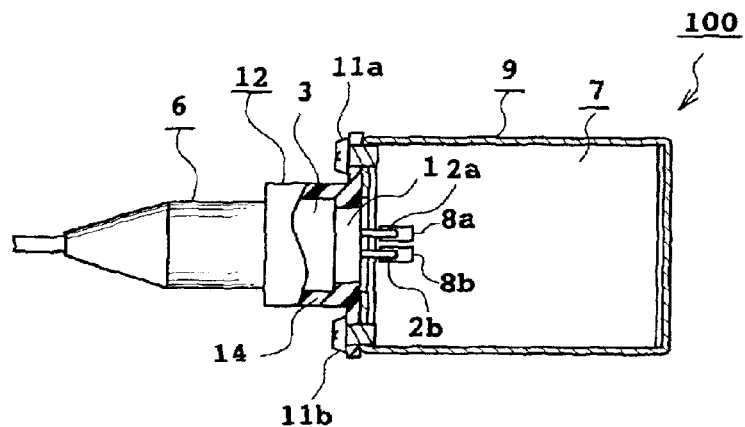
FIG. 1C shows partly in section the major part of the optical transmitter/receiver 100 depicted in FIG. 1A.
Figure 1D:
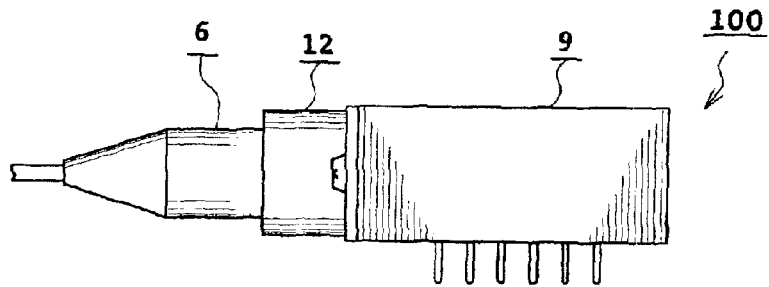
FIG. 1D is a front elevational view of the optical transmitter/receiver 100 depicted in FIG. 1A.

FIG. 1A is an exploded view showing an example configuration of the optical transmitter/receiver generally designated at 100; FIG. 1B is a side elevational view of the optical transmitter/receiver 100 depicted in FIG. 1A; FIG. 1C shows partly in section the major part of the optical transmitter/receiver 100; and FIG. 1D is a front elevational view of the optical transmitter/receiver 100. The optical transmitter/receiver 100 in accordance with a first embodiment of the present invention comprises a coaxial optical semiconductor element module 6; an electronic circuit board 7 electrically connected to the optical semiconductor element module 6 and having pads 8a and 8b placed on the surface thereof; an electrically conductive casing 9 in the form of, e.g., a sheet metal case, which accommodates and electromagnetically shield the electronic circuit board 7; and a resin flange 12 interposed between the optical semiconductor element module 6 and the electrically conductive casing 9, the resin flange 12 being fitted with the optical semiconductor module 6 and fixedly secured to the electrically conductive casing 9 by means of screws 11a and 11b. The optical semiconductor element module 6 includes a stem 1 incorporating an optical semiconductor element; lead terminals 2a and 2b extending from the stem 1 for electrical connection with the optical semiconductor element; a can 3 partially covering the stem 1; a trunk 4 extending from the can 3; and a fiber 5 disposed on the trunk 4. The resin flange 12 includes an opening 13 having a portion of larger inner diameter than the outer diameter of the can 3 of the optical semiconductor element module 6; and a shoulder 14 defined in the opening 13 between the larger inner diameter portion and a portion with smaller inner diameter than the outer diameter of the can 3 of the optical semiconductor element module 6.

In the thus configured optical transmitter/receiver 100, the electronic circuit board 7 is securely retained in the electrically conductive casing 9, by adhesion, for example, and the lead terminals 2a, 2b of the optical semiconductor element module 6 are connected respectively to the pads 8a, 8b on the surface of the electronic circuit board 7, by soldering, for example, for transmission/reception and conversion of optical/electric signals. The optical semiconductor element module 6 is inserted into the opening 13 formed in the flange 12 and fixedly retained therein with the can 3 abutting against the shoulder 14, and the electrically conductive casing 9 and the resin flange 12 are firmly fastened together, by screwing, for example. As a result, the optical semiconductor element module 6 and the electrically conductive casing 9 are securely connected together by way of the resin flange 12 so that heat generated in the electronic circuit board 7 is cut off by the resin flange 12 so as not to be transmitted to the optical semiconductor element module 6, thereby suppressing any degradation in and variation of characteristics of the optical semiconductor element module 6 arising from the variance of temperature, making it possible to obtain an optical transmitter/receiver having superior and stable performance.

An optical transmitter/receiver in accordance with a second embodiment of the present invention will next be described.

Figure 2A:
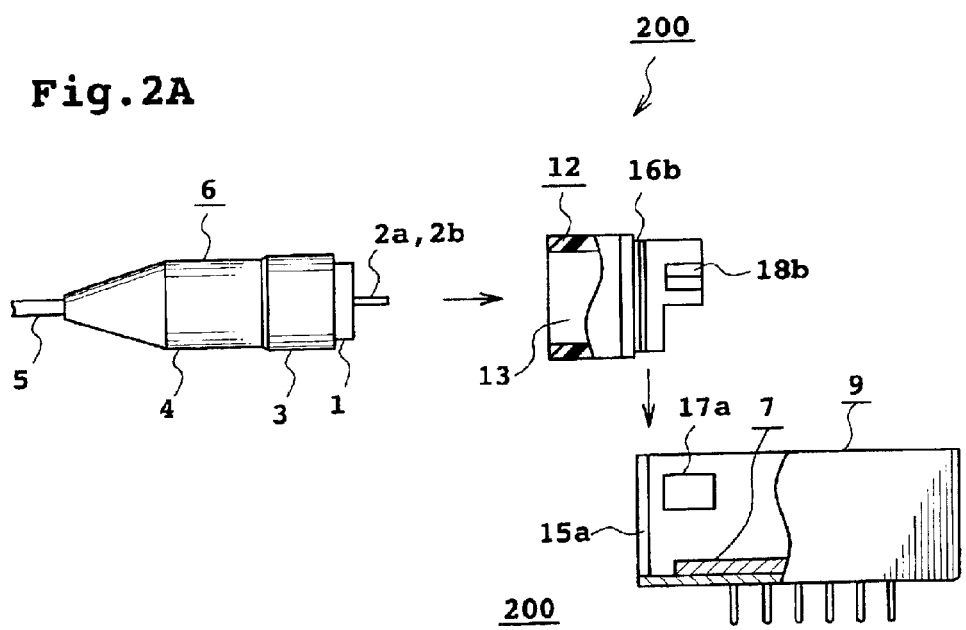
FIG. 2A is an exploded view showing an example of configuration of an optical transmitter/receiver 200.
Figure 2B:
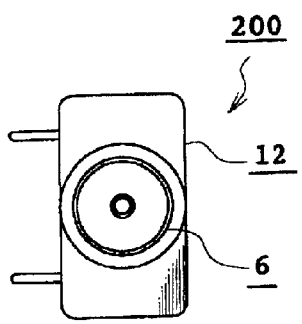
FIG. 2B is a side elevational view of the optical transmitter/receiver 200 depicted in FIG. 2A.
Figure 2C:
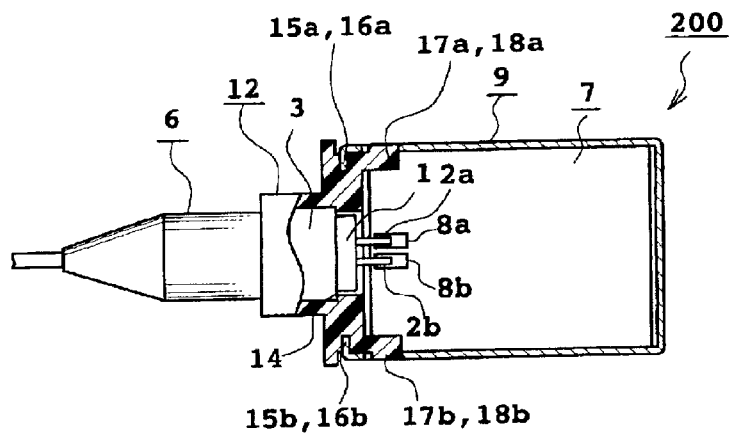
FIG. 2C shows partly in section the major part of the optical transmitter/receiver 200 depicted in FIG. 2A.
Figure 2D:
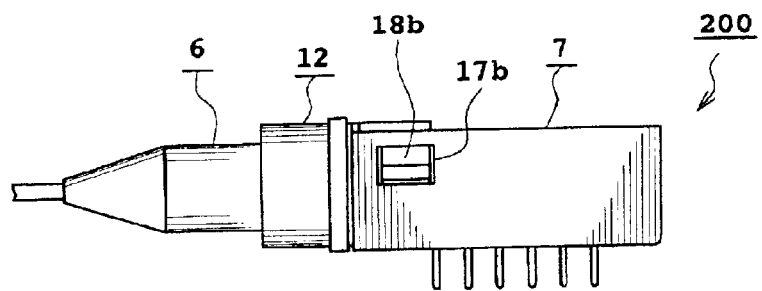
FIG. 2D is a front elevational view of the optical transmitter/receiver 200 depicted in FIG. 2A.

FIG. 2A is an exploded view showing an example configuration of the optical transmitter/receiver generally designated at 200; FIG. 2B is a side elevational view of the optical transmitter/receiver 200 depicted in FIG. 2A; FIG. 2C shows partly in section the major part of the optical transmitter/receiver 200; and FIG. 2D is a front elevational view of the optical transmitter/receiver 200. The resin flange 12 of the optical transmitter/receiver 200 includes slits 16a and 16b formed in its right and left sidewalls and protrusions 18a and 18b formed on its outer surface. In right and left sidewalls of the electrically conductive casing 9 are apertures 17a and 17b.

The optical transmitter/receiver 200 is configured in this manner. With the slits 16a, 16b and the protrusions 18a, 18b provided in and on the sidewalls of the resin flange 12 of the first embodiment, the resin flange 12 is fitted slidably on the electrically conductive casing 9 from above such that the slits 16 and 16b can mate with front faces 15a and 15b, respectively, of the electrically conductive casing 9. At this point, the protrusions 18a and 18b initially spread the right and left sidewalls of the electrically conductive casing 9 outward within the range of elastic deformation thereof. When the protrusions 18a and 18b snap into the apertures 17a and 17b formed in the right and left sidewalls, the elastic deformation of the right and left walls of the electrically conductive casing 9 is removed so that the resin flange can fixedly be clamped by the electrically conductive casing 9. As a result, it is possible to remove the screwing or adhesion step required for firmly fastening the electrically conductive casing 9 and the resin flange 12.

An optical transmitter/receiver in accordance with a third embodiment of the present invention will next be described.

Figure 3A:
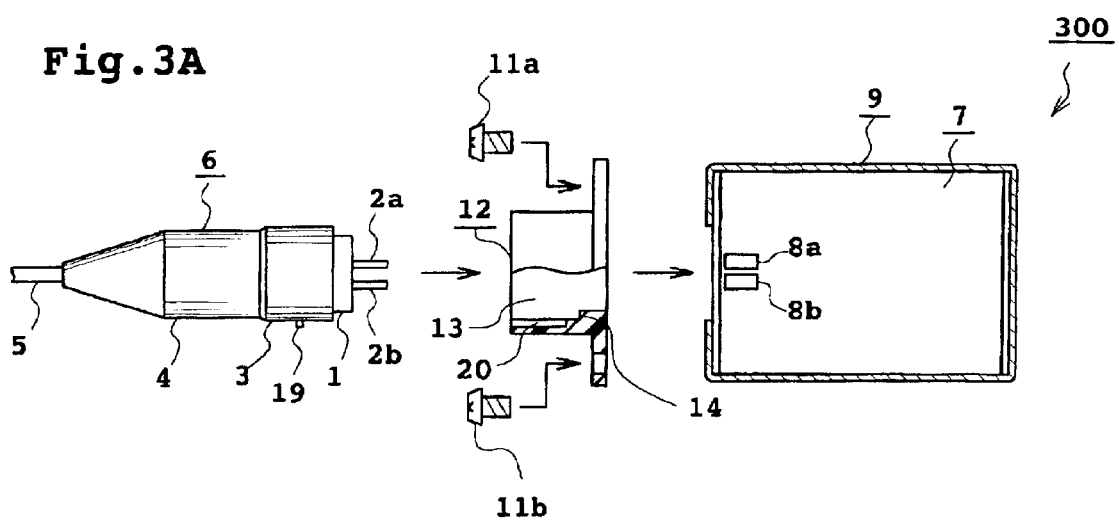
FIG. 3A is an exploded view showing an example of configuration of an optical transmitter/receiver 300.
Figure 3B:
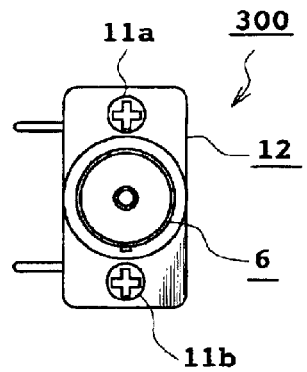
FIG. 3B is a side elevational view of the optical transmitter/receiver 300 depicted in FIG. 3A.
Figure 3C:
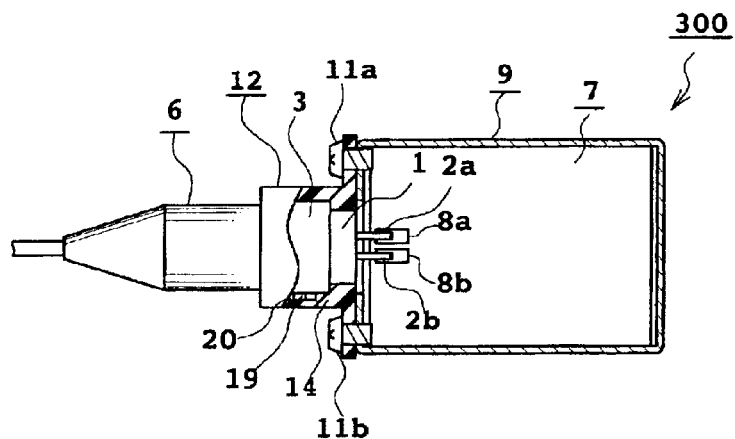
FIG. 3C shows partly in section the major part of the optical transmitter/receiver 300 depicted in FIG. 3A.
Figure 3D:
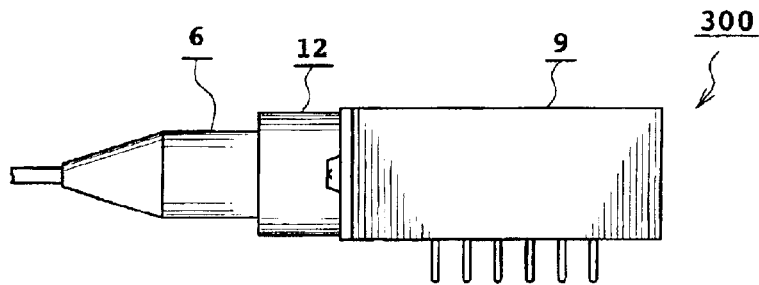
FIG. 3D is a front elevational view of the optical transmitter/receiver 300 depicted in FIG. 3A.

FIG. 3A is an exploded view showing an example configuration of the optical transmitter/receiver generally designated at 300; FIG. 3B is a side elevational view of the optical transmitter/receiver 300 depicted in FIG. 3A; FIG. 3C shows partly in section the major part of the optical transmitter/receiver 300; and FIG. 3D is a front elevational view of the optical transmitter/receiver 300. The optical semiconductor element module 6 of the optical transmitter/receiver 300 has a key boss 19 formed on the outer surface of the can 3. The resin flange 12 has a key groove 20 formed in the inner surface of the opening 13, for meshing with the key boss 19. Upon assembly, the optical semiconductor element module 6 is inserted into the opening 13 of the resin flange 12. The key boss 19 is fitted in the key groove 20 at that time, and the key groove 20 is shaped and dimensioned so as to allow the lead terminals 2a and 2b of the optical semiconductor element module 6 to come to a register with the pads 8a and 8b, respectively, when the key boss 19 fits therein. Also in the event that the resin flange 12 is fitted to the electrically conductive casing 9 after insertion of the optical semiconductor element module 6 into the resin flange 12, the key groove 20 is shaped and dimensioned so as to allow the lead terminals 2a and 2b of the optical semiconductor element module 6 to come to a register with the pads 8a and 8b, respectively, when the key boss 19 is fitted into the key groove 20.

The optical transmitter/receiver 300 is thus configured. By providing the key boss 19 on the outer periphery of the can 3 of the optical semiconductor element module 6 and providing the key groove 13 in the opening 13 of the resin flange 12, the key boss 19 can be fitted in the key groove 13 when the optical semiconductor element module 6 is inserted into the opening 13 in order to fixedly retain the module 6 in the resin flange 12, whereby the position in the rotational direction of the optical semiconductor element module 6 is uniquely determined. This enables omission of the alignment step required when the lead terminals 2a, 2b of the optical semiconductor element module 6 is soldered to the pads 8a, 8b formed on the electronic circuit board 7.

An optical transmitter/receiver in accordance with a fourth embodiment of the present invention will next be described.

Figure 4A:
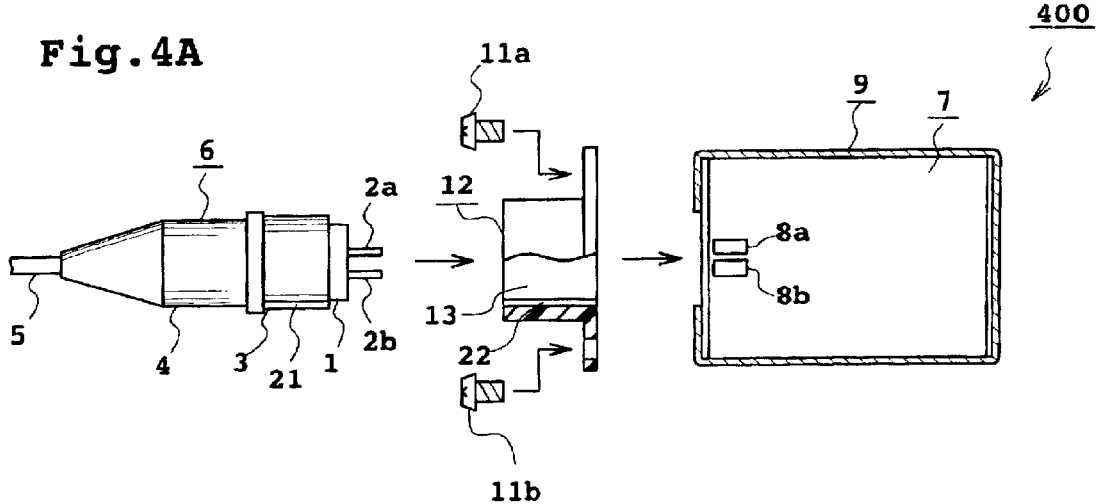
FIG. 4A is an exploded view showing an example of configuration of an optical transmitter/receiver 400.
Figure 4B:
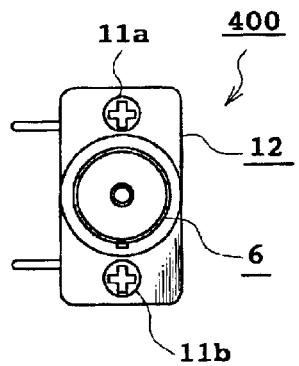
FIG. 4B is a side elevational view of the optical transmitter/receiver 400 shown in FIG. 4A.
Figure 4C:
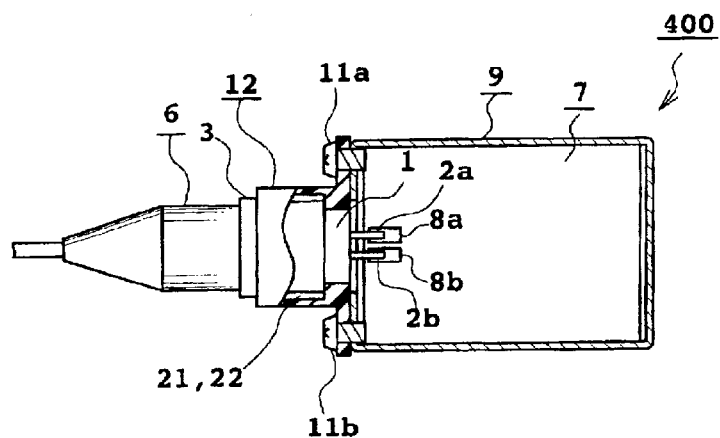
FIG. 4C shows partly in section the major part of the optical transmitter/receiver 400 shown in FIG. 4A.
Figure 4D:
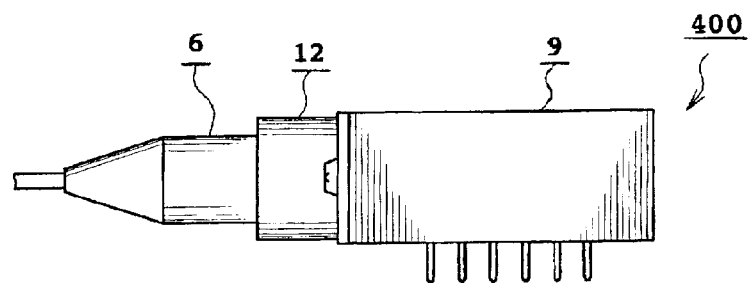
FIG. 4D is a front elevational view of the optical transmitter/receiver 400 shown in FIG. 4A.

FIG. 4A is an exploded view showing an example configuration of the optical transmitter/receiver generally designated at 400; FIG. 4B is a side elevational view of the optical transmitter/receiver 400 depicted in FIG. 4A; FIG. 4C shows partly in section the major part of the optical transmitter/receiver 400; and FIG. 4D is a front elevational view of the optical transmitter/receiver 400. The optical semiconductor element module 6 of the optical transmitter/receiver 400 is provided with an externally threaded portion 21 formed on the outer surface of the can 3. The resin flange 12 is provided with an internally threaded portion 22 adapted to engage the externally threaded portion 21 when the optical semiconductor element module 6 is inserted into the inner surface of the opening 13.

The optical transmitter/receiver 400 is configured in this manner. With provision of the externally threaded portion 21 on the outer periphery of the can 3 of the optical semiconductor element module 6 of the first embodiment and with provision of the internally threaded portion 22 in the opening 13 of the resin flange 12, the externally threaded portion 21 is screwed into the internally threaded portion 22 whereby it is possible to omit the bonding step required, for example, for fixedly fastening the optical semiconductor element module 6 and the resin flange 12 together.

Figure 5A:
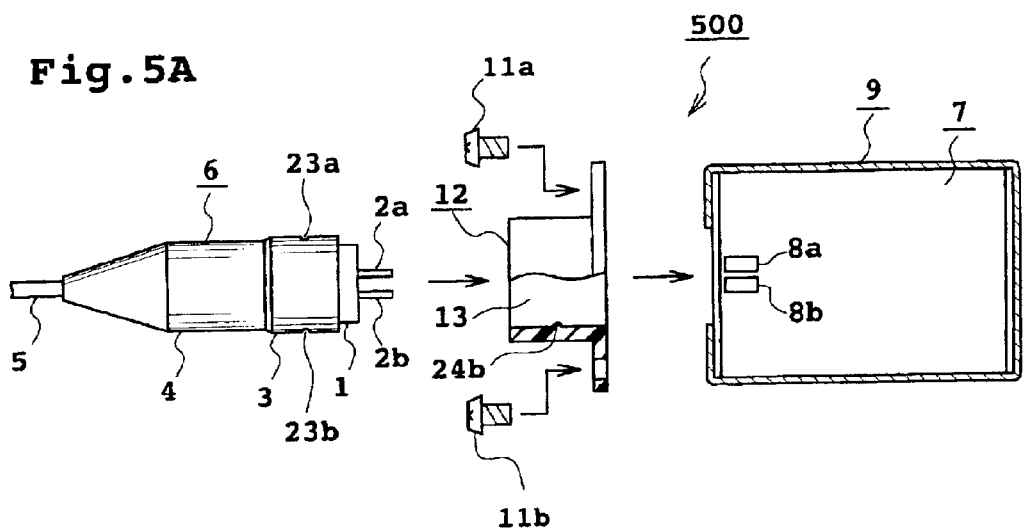
FIG. 5A is an exploded view showing an example of configuration of an optical transmitter/receiver 500.
Figure 5B:
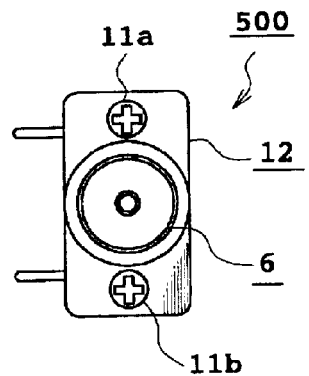
FIG. 5B is a side elevational view of the optical transmitter/receiver 500 shown in FIG. 5A.
Figure 5C:
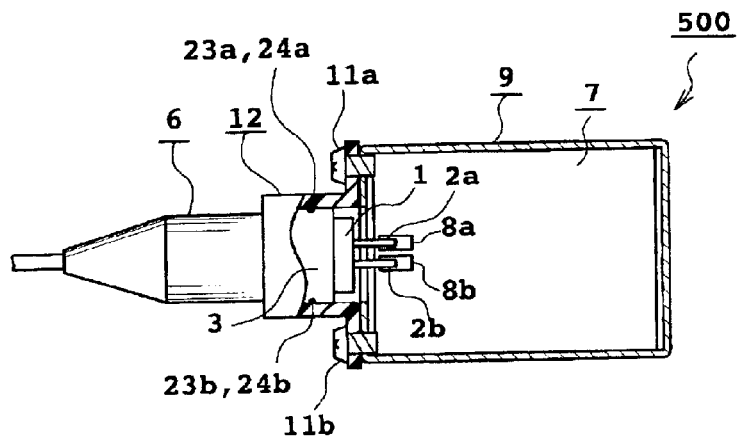
FIG. 5C shows partly in section the major part of the optical transmitter/receiver 500 shown in FIG. 5A.
Figure 5D:
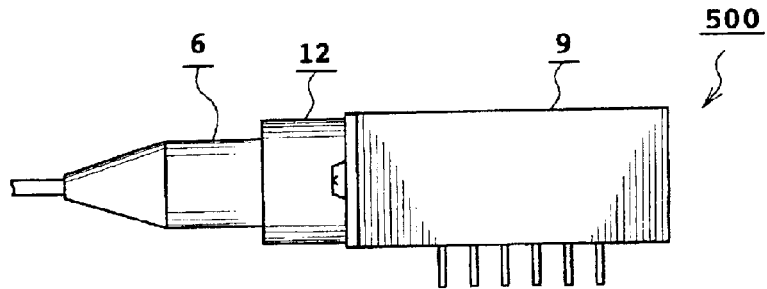
FIG. 5D is a front elevational view of the optical transmitter/receiver 500 shown in FIG. 5A.

An optical transmitter/receiver in accordance with a fifth embodiment of the present invention will next be described. FIG. 5A is an exploded view showing an example of configuration of the optical transmitter/receiver generally designated at 500; FIG. 5B is a side elevational view of the optical transmitter/receiver 500 depicted in FIG. 5A; FIG. 5C shows partly in section the major part of the optical transmitter/receiver 500; and FIG. 5D is a front elevational view of the optical transmitter/receiver 500. The optical semiconductor element module 6 of the optical transmitter/receiver 500 is provided with recessed portions 23a and 23b formed in the outer surface of the can 3. The resin flange 12 is provided with raised portions 24a and 24b which fit in the recessed portions 23a and 23b when the optical semiconductor element module 6 is inserted into the inner surface of the opening 13.

The optical transmitter/receiver 500 is configured in the following manner. Because the recessed portions 23a and 23b are provided in the outer periphery of the can 3 of the optical semiconductor element module 6 in accordance with the first embodiment, and because the raised portions 24a and 24b are provided on the opening 13 of the resin flange 12, the can 3 and the raised portions 24a, 24b will initially interfere with each other when the optical semiconductor element module 6 is inserted into the opening 13. Hence, the insertion of the optical semiconductor element module 6 is initially made in a slightly press fitted manner within the range of the elastic deformation of the resin flange 12. However, once the recessed portions 23a, 23b are engaged with the raised portions 24a, 24b, the elastic deformation of the resin flange 12 rebounds, allowing the optical semiconductor element module 6 to be fixed and clamped by the resin flange 12. In this way, it is possible to omit the step of, e.g., bonding for firmly retaining the optical semiconductor element module 6 and the resin flange 12. Furthermore, because the position in the rotational direction of the optical semiconductor element module 6 is uniquely determined, the alignment step for soldering the lead terminals 2a, 2b of the optical semiconductor element module 6 to the pads 8a, 8b formed on the electronic circuit board 7 can be omitted.

Figure 6A:
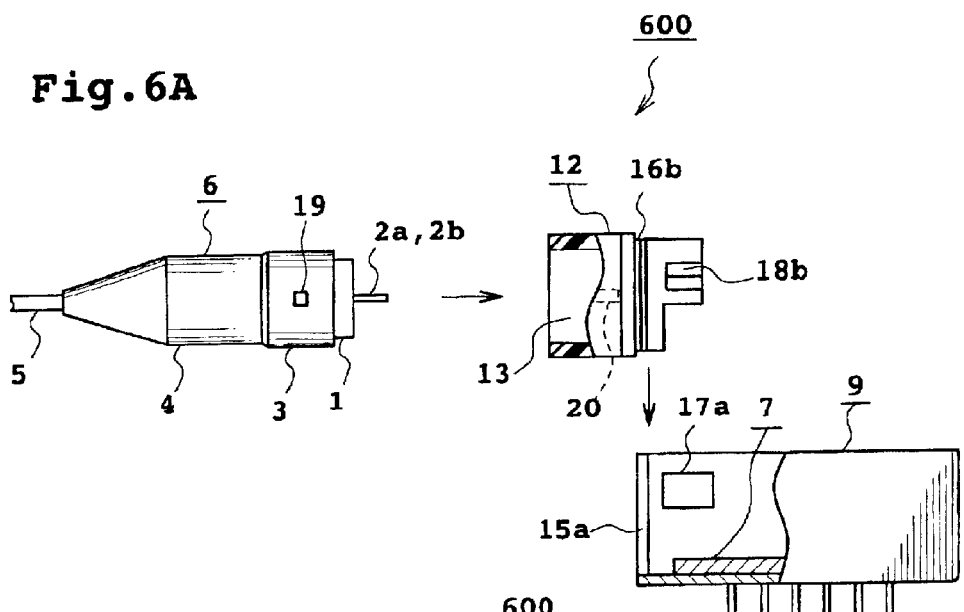
FIG. 6A is an exploded view showing an example of configuration of an optical transmitter/receiver 600.
Figure 6B:
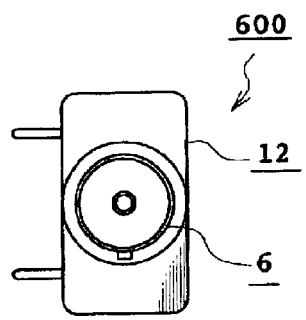
FIG. 6B is a side elevational view of the optical transmitter/receiver 600 shown in FIG. 6A.
Figure 6C:
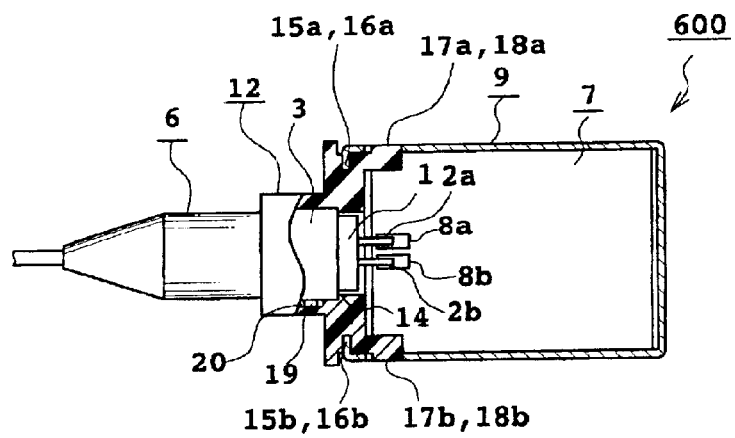
FIG. 6C shows partly in section the major part of the optical transmitter/receiver 600 shown in FIG. 6A.
Figure 6D:
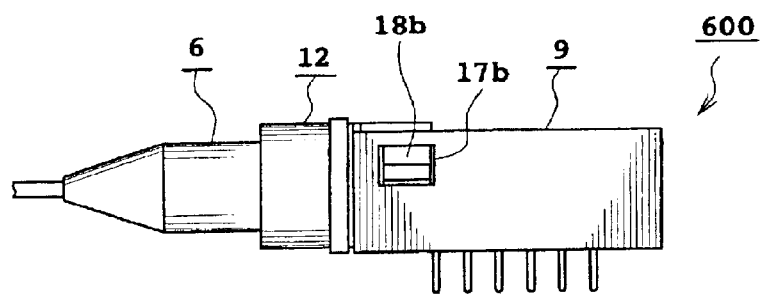
FIG. 6D is a front elevational view of the optical transmitter/receiver 600 shown in FIG. 6A.

An optical transmitter/receiver in accordance with a sixth embodiment of the present invention will next be described. FIG. 6A is an exploded view showing an example configuration of the optical transmitter/receiver generally designated at 600; FIG. 6B is a side elevational view of the optical transmitter/receiver 600 depicted in FIG. 6A; FIG. 6C shows partly in section the major part of the optical transmitter/receiver 600; and FIG. 6D is a front elevational view of the optical transmitter/receiver 600. The optical transmitter/receiver 600 has a combined configuration of the optical transmitter/receiver 200 of the second embodiment and the optical transmitter/receiver 300 of the third embodiment.

When assembling the thus configured optical transmitter/receiver 600, the resin flange 12 is slidably fitted on the electrically conductive casing 9 in such a manner that the slits 16a and 16b formed on the right and left sidewalls of the resin flange 12 mate with the front faces 15a and 15b of the electrically conductive casing 9. At this point, the protrusions 18a and 18b initially spread the right and left sidewalls of the electrically conductive casing 9 outward within the range of elastic deformation. Once the protrusions 18a and 18b are fitted into the apertures 17a and 17b formed in the right and left sidewalls of the electrically conductive casing 9, the elastic deformation of the right and left sidewalls of the electrically conductive casing 9 will rebound, allowing the resin flange 12 to be clamped by the electrically conductive casing 9. It is thus possible to omit the step of, e.g., screwing or bonding for fixing and retaining the electrically conductive casing 9 and the resin flange 12. Furthermore, by fitting the key boss 19 in the key groove 20 when inserting the optical semiconductor element module 6 into the opening 13 of the resin flange 12 for fixed retainment to the resin flange 12, the optical semiconductor element module 6 can be positioned uniquely in the direction of rotation, with the result that it is also possible to omit the alignment step required when the lead terminals 2a, 2b of the optical semiconductor element module 6 are soldered to the pads 8a, 8b formed on the electronic circuit board 7.

Figure 7A:
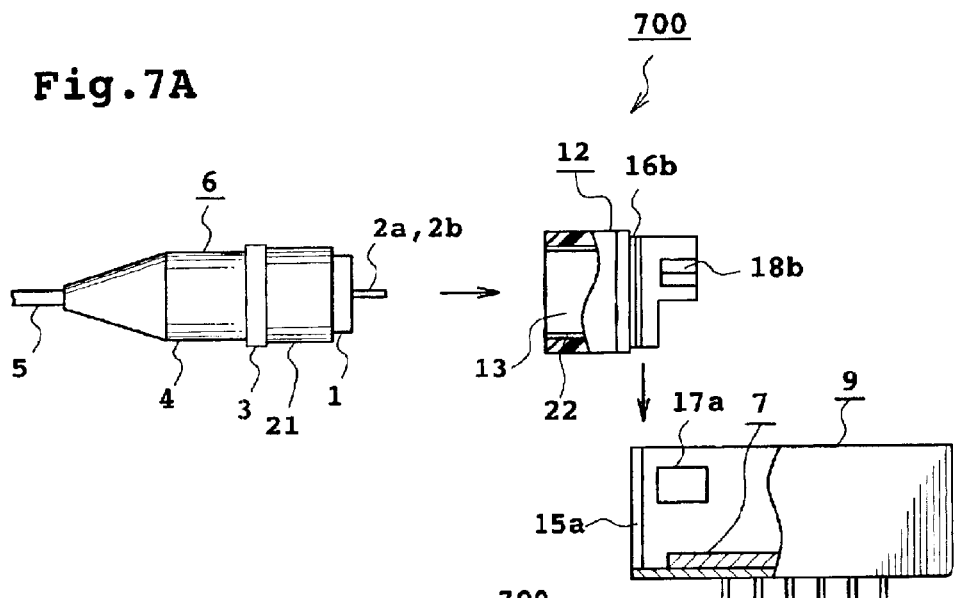
FIG. 7A is an exploded view showing an example of configuration of an optical transmitter/receiver 700.
Figure 7B:
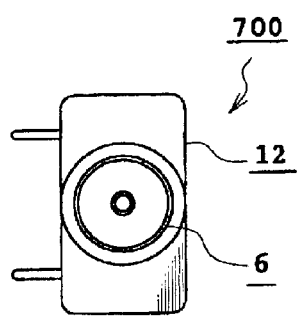
FIG. 7B is a side elevational view of the optical transmitter/receiver 700 illustrated in FIG. 7A.
Figure 7C:
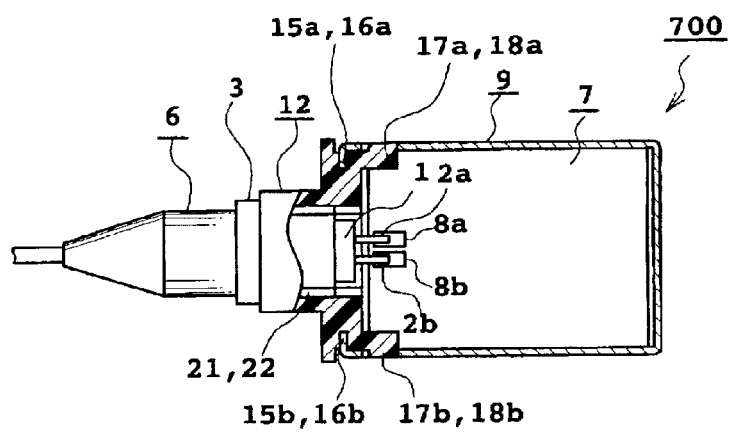
FIG. 7C shows partly in section the major part of the optical transmitter/receiver 700 illustrated in FIG. 7A.
Figure 7D:
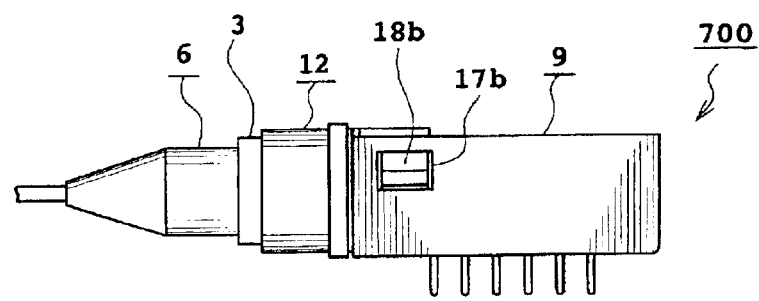
FIG. 7D is a front elevational view of the optical transmitter/receiver 700 illustrated in FIG. 7A.

An optical transmitter/receiver in accordance with a seventh embodiment of the present invention will next be described. FIG. 7A is an exploded view showing an example configuration of the optical transmitter/receiver generally designated at 700; FIG. 7B is a side elevational view of the optical transmitter/receiver 700 depicted in FIG. 7A; FIG. 7C shows partly in section the major part of the optical transmitter/receiver 700; and FIG. 7D is a front elevational view of the optical transmitter/receiver 700. The optical transmitter/receiver 700 has a combined configuration of the optical transmitter/receiver 200 of the second embodiment and the optical transmitter/receiver 400 of the fourth embodiment.

When assembling the thus configured optical transmitter/receiver 700, the resin flange 12 is slidably fitted on the electrically conductive casing 9 in such a manner that the slits 16a and 16b formed on the right and left sidewalls of the resin flange 12 mate with the front faces 15a and 15b of the electrically conductive casing 9. At that time, the protrusions 18a and 18b initially spread the right and left sidewalls of the electrically conductive casing 9 outward within the range of elastic deformation. Once the protrusions 18a and 18b are fitted into the apertures 17a and 17b formed in the right and left sidewalls of the electrically conductive casing 9, the elastic deformation of the right and left sidewalls of the electrically conductive casing 9 will rebound, allowing the resin flange 12 to be firmed and clamped by the electrically conductive casing 9. It is thus possible to omit the step of, e.g., screwing or bonding for fixedly retaining the electrically conductive casing 9 and the resin flange 12. Furthermore, by screwing the externally threaded portion 21 into the internally threaded portion 22, it is also possible to omit the step of, e.g., bonding required for fixedly retaining the optical semiconductor element module 6 and the resin flange 12.

Figure 8A:
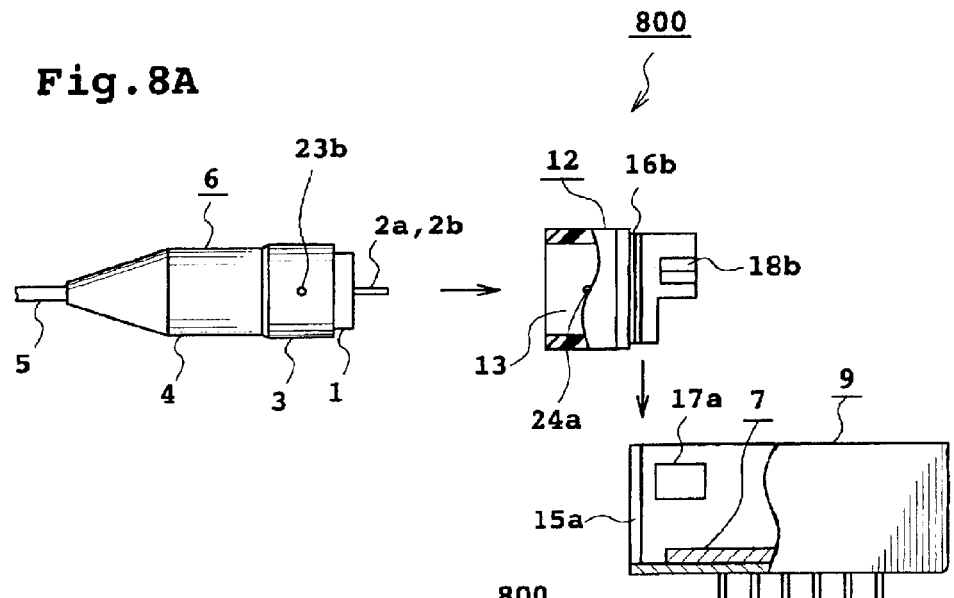
FIG. 8A is an exploded view showing an example of configuration of an optical transmitter/receiver 800.
Figure 8B:
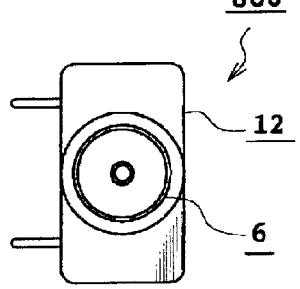
FIG. 8B is a side elevational view of the optical transmitter/receiver 800 illustrated in FIG. 8A.
Figure 8C:
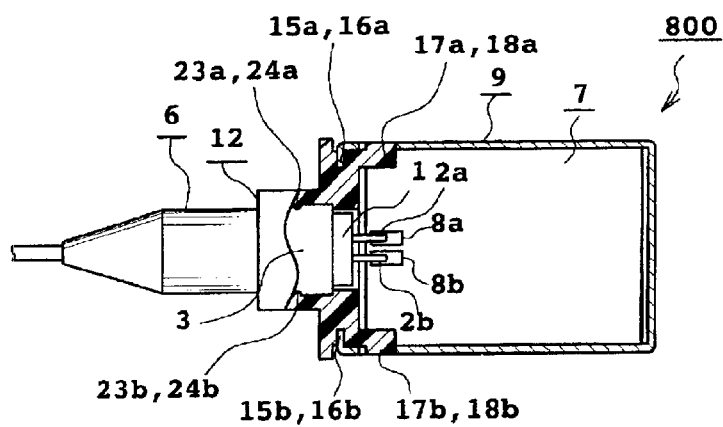
FIG. 8C shows partly in section the major part of the optical transmitter/receiver 800 illustrated in FIG. 8A.
Figure 8D:
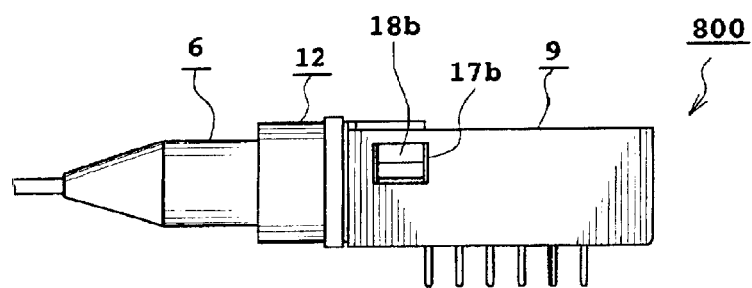
FIG. 8D is a front elevational view of the optical transmitter/receiver 800 illustrated in FIG. 8A.
Figure 9A:
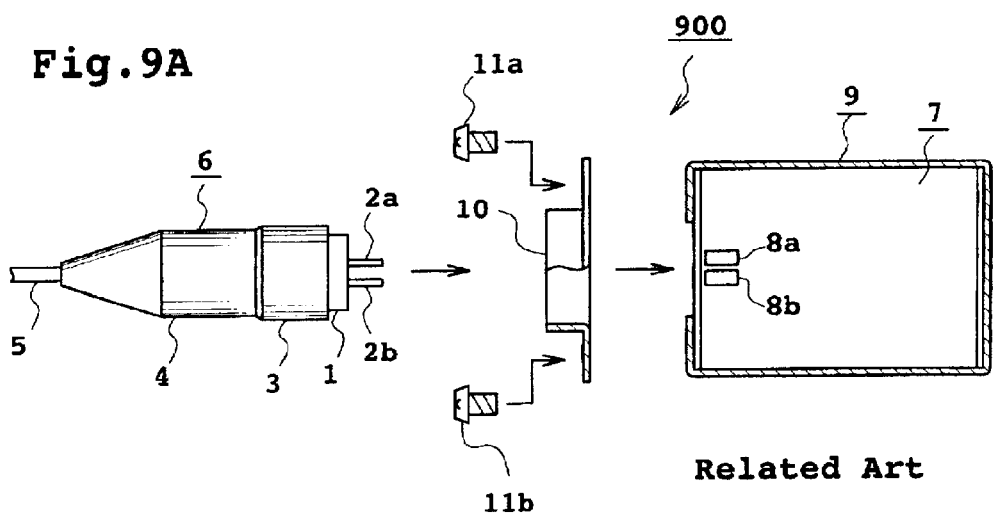
FIG. 9A is an exploded view showing an example of configuration of a typical optical transmitter/receiver 900.
Figure 9B:
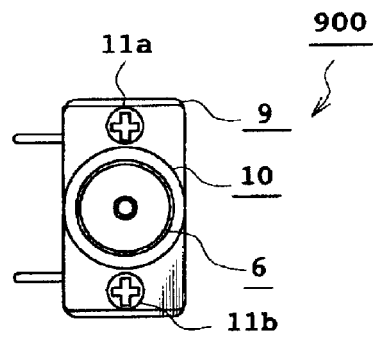
FIG. 9B is a side elevational view of the optical transmitter/receiver 900 illustrated in FIG. 9A.
Figure 9C:
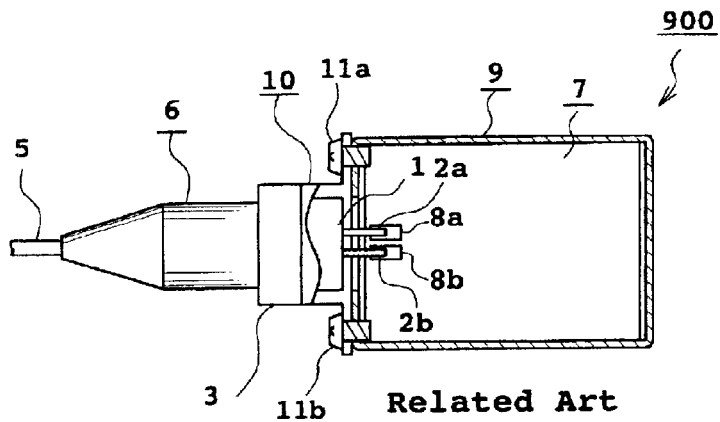
FIG. 9C shows partly in section the major part of the optical transmitter/receiver 900 illustrated in FIG. 9A.
Figure 9D:
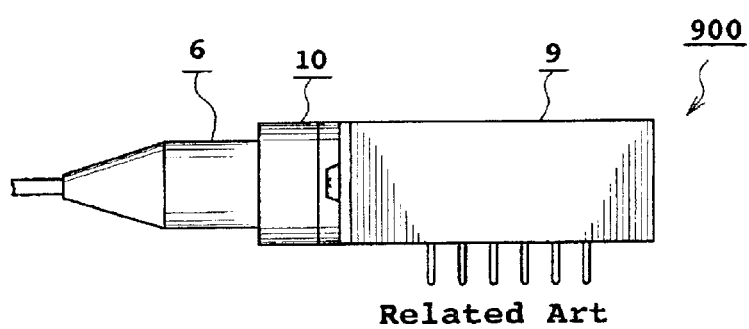
FIG. 9D is a front elevational view of the optical transmitter/receiver 900 illustrated in FIG. 9A.

An optical transmitter/receiver in accordance with an eighth embodiment of the present invention will next be described. FIG. 8A is an exploded view showing an example of configuration of the optical transmitter/receiver generally designated at 800; FIG. 8B is a side elevational view of the optical transmitter/receiver 800 depicted in FIG. 8A; FIG. 8C shows partly in section the major part of the optical transmitter/receiver 800; and FIG. 8D is a front elevational view of the optical transmitter/receiver 800. The configuration of the optical transmitter/receiver 800 is a combination of the optical transmitter/receiver 200 of the second embodiment and the optical transmitter/receiver 500 of the fifth embodiment.

When assembling the thus configured optical transmitter/receiver 800, the resin flange 12 is slidably fitted on the electrically conductive casing 9 in such a manner that the slits 16a and 16b formed on the right and left sidewalls of the resin flange 12 mate with the front faces 15a and 15b of the electrically conductive casing 9. At that time, the protrusions 18a and 18b initially spread the right and left sidewalls of the electrically conductive casing 9 outward within the range of elastic deformation. Once the protrusions 18a and 18b are fitted into the apertures 17a and 17b formed in the right and left sidewalls of the electrically conductive casing 9, the elastic deformation of the right and left sidewalls of the electrically conductive casing 9 will rebound, allowing the resin flange 12 to be firmed and clamped by the electrically conductive casing 9. It is thus possible to omit the step of, e.g., screwing or bonding for fixedly retaining the electrically conductive casing 9 and the resin flange 12. Furthermore, the can 3 and the raised portions 24a, 24b will initially interfere with each other when the optical semiconductor element module 6 is inserted into the opening 13 of the resin flange 12. Hence, the insertion of the optical semiconductor element module 6 is initially made in a slightly press fitted manner within the range of the elastic deformation of the resin flange 12. Once the recessed portions 23a, 23b are engaged with the raised portions 24a, 24b, the elastic deformation of the resin flange 12 is cancelled allowing the optical semiconductor element module 6 to be fixed and clamped by the resin flange 12. In this manner, it is possible to omit the step of, e.g., bonding for firming and retaining the optical semiconductor element module 6 and the resin flange 12. Furthermore, because the position in the rotational direction of the optical semiconductor element module 6 is uniquely determined, the alignment step for soldering the lead terminals 2a, 2b of the optical semiconductor element module 6 to the pads 8a, 8b formed on the electronic circuit board 7 can also be omitted.

In the optical transmitters/receivers of the above embodiments, metal plating may be applied to the outer surfaces, i.e., surfaces excepting the opening 13, key groove 20, internally threaded portion 22 and raised portions 24a and 24b of the resin flange 12.

If metal plating is applied, the thus metal plated resin flange 12 provides an electromagnetic shield for the optical semiconductor element module 6 so as to be less influenced by electromagnetic noises, contributing to acquisition of the optical transmitter/receiver having more stable performances.

In the optical transmitters/receivers of the above embodiments, an electrically conductive adhesive sheet may be used for fixation of the electronic circuit board 7 and the electrically conductive casing 9.

In this manner, by firmly bonding the electronic circuit board 7 and the electrically conductive casing 9 by use of the electrically conductive adhesive sheet, the heat transfer action of metal additives contained in the electrically conductive adhesive sheet will allow the heat generated in the electronic circuit board 7 to positively migrate to the electrically conductive casing 9. It is thus possible to obtain a high-performance optical transmitter/receiver with an increased allowable heat value and further to omit a spread managing step and a cleaning step for squeezed-out adhesive, as compared with the case of using liquid adhesive, for example.

Although the above embodiments have been described as being directed to an optical transmitter/receiver by way of example, the present invention is equally applicable to other electronic apparatuses having a semiconductor module.

While illustrative and presently preferred embodiments of the present invention have been described in detail herein, it is to be understood that the inventive concepts may be otherwise variously embodied and employed and that the appended claims are intended to be construed to include such variations, except insofar as limited by the prior art.

What is claimed is:

1. An electronic apparatus comprising:
   an electronic circuit board;
   an electrically conductive casing for encasing said electronic circuit board;
   a semiconductor element module having lead terminals electrically connected to said electronic circuit board, said semiconductor element module having a column-shaped section, an axis of said column-shaped section being parallel to a direction of extension of said lead terminals; and
   a resin fixture intervening between said electrically conductive casing and said semiconductor element module, said resin fixture mounted with said semiconductor element module, said resin fixture having a cylinder-shaped section for retaining, in its inner periphery, said column-shaped section of said semiconductor element module, a surface of an outer periphery and end of said cylinder-shaped section being plated and a surface of said inner periphery of said cylinder-shaped section not being plated, and
   said resin fixture, on another side of said cylinder-shaped section, directly fitted to said electrically conductive casing.

2. An electronic apparatus according to claim 1, wherein said semiconductor element module has a raised portion formed on its outer surface at a site where said semiconductor element module is fitted to said resin fixture, and wherein
   said resin fixture has a recessed portion formed in its inner surface at a site where said semiconductor module is mounted, said recessed portion being fitted to said raised portion.

3. An electronic apparatus according to claim 1, wherein said semiconductor element module has an externally threaded portion formed on its outer surface at a site where said semiconductor element module is fitted to said resin fixture, and wherein
   said resin fixture has an internally threaded portion formed in its inner surface at a site where said semiconductor module is mounted, said externally threaded portion being screwed into said internally threaded portion.

4. An electronic apparatus according to claim 1, wherein said semiconductor element module has a recessed portion formed in its outer surface at a site where said semiconductor element module is fitted to said resin fixture, and wherein
   said resin fixture has a raised portion formed on its inner surface at a site where said semiconductor module is mounted, said raised portion being fitted to said recessed portion.

5. An electronic apparatus according to claim 1, wherein said electronic circuit board is bonded to and encased in said electrically conductive casing by use of an electrically conductive adhesive sheet.

6. An electronic apparatus according to claim 1, wherein said semiconductor element module has a raised portion formed on its outer surface at a site where said semiconductor element module is fitted to said resin fixture, and wherein said resin fixture has a notched portion formed in its outer wall and has a recessed portion formed in the inner surface at a site where said semiconductor module is mounted, said recessed portion being fitted to said raised portion, and wherein said electrically conductive casing has a hooked portion which fits said notched portion of said resin fixture.

7. An electronic apparatus according to claim 1, wherein said semiconductor element module has an externally threaded portion formed on its outer surface at a site where said semiconductor element module is fitted to said resin fixture, and wherein said resin fixture has a notched portion formed in its outer wall and has an internally threaded portion formed in its inner surface at a site where said semiconductor module is mounted, said externally threaded portion being screwed into said internally threaded portion, and wherein said electrically conductive casing has a hooked portion which fits said notched portion of said resin fixture.

8. An electronic apparatus according to claim 1, wherein said semiconductor element module has a recessed portion formed in its outer surface at a site where said semiconductor element module is fitted to said resin fixture, and wherein said resin fixture has a notched portion formed in its outer wall and has a raised portion formed on its inner surface at a site where said semiconductor module is mounted, said raised portion being fitted to said recessed portion, and wherein said electrically conductive casing has a hooked portion which fits said notched portion of said resin fixture.

9. An electronic apparatus according to claim 1, wherein said semiconductor element module has a raised portion formed on its outer surface at a site where said semiconductor element module is fitted to said resin fixture, and wherein said resin fixture has a protrusion formed on its outer surface and has a recessed portion formed in its inner surface at a site where said semiconductor module is mounted, said recessed portion being fitted to said raised portion, and wherein said electrically conductive casing has an insertion hole which receives said protrusion of said resin fixture.

10. An electronic apparatus according to claim 1, wherein said semiconductor element module has an externally threaded portion formed on its outer surface at a site where said semiconductor element module is fitted to said resin fixture, and wherein said resin fixture has a protrusion formed on its outer surface and has an internally threaded portion formed in its inner surface at a site where said semiconductor module is mounted, said externally threaded portion being screwed into said internally threaded portion, and wherein said electrically conductive casing has an insertion hole which receives said protrusion of said resin fixture.

11. An electronic apparatus according to claim 1, wherein said semiconductor element module has a recessed portion formed in its outer surface at a site where said semiconductor element module is fitted to said resin fixture, and wherein said resin fixture has a protrusion formed on its outer surface and has a raised portion formed on its inner surface at a site where said semiconductor module is mounted, said raised portion being fitted to said recessed portion, and wherein said electrically conductive casing has an insertion hole which receives said protrusion of said resin fixture.

12. An electronic apparatus comprising:

an electronic circuit board;

an electrically conductive casing for encasing said electronic circuit board;

a coaxial optical semiconductor element module electrically connected to said electronic circuit board via a plurality of lead terminals, said semiconductor element module having a column-shaped section, an axis of said column-shaped being parallel to a direction of extension of said lead terminals; and a resin fixture intervening between said electrically conductive casing and said semiconductor element module, said resin fixture mounted with said semiconductor element module and fitted to said electrically conductive casing, said resin fixture having an opening having an inner diameter which is larger than an outer diameter of said column-shaped section of said semiconductor element module, said opening retaining said column-shaped section therein, an outer periphery surface of said resin fixture being metal plated and an inside surface of said opening not being metal plated.

13. The electronic apparatus according to claim 1, wherein the resin fixture has a heat insulating property with respect to the heat generated by the electronic circuit board.

* * * * *